United States Patent
Haywood et al.

(10) Patent No.: US 8,898,368 B2
(45) Date of Patent: Nov. 25, 2014

(54) REDRIVEN/RETIMED REGISTERED DUAL INLINE MEMORY MODULE

(75) Inventors: Christopher Haywood, Thousand Oaks, CA (US); Gopal Raghavan, Thousand Oaks, CA (US)

(73) Assignee: Inphi Corporation, Westlake Village, CA (US)

( * ) Notice: Subject to any disclaimer, the term of this patent is extended or adjusted under 35 U.S.C. 154(b) by 1186 days.

(21) Appl. No.: 12/267,355

(22) Filed: Nov. 7, 2008

(65) Prior Publication Data

US 2009/0119451 A1    May 7, 2009

Related U.S. Application Data

(60) Provisional application No. 60/986,225, filed on Nov. 7, 2007.

(51) Int. Cl.
*G06F 13/00* (2006.01)
*G11C 5/04* (2006.01)
*G06F 13/16* (2006.01)
*G06F 13/40* (2006.01)

(52) U.S. Cl.
CPC .............. *G11C 5/04* (2013.01); *G06F 13/1694* (2013.01); *G06F 13/4072* (2013.01)
USPC ................................................ 711/5; 710/305

(58) Field of Classification Search
USPC ................................................ 711/5; 710/305
See application file for complete search history.

(56) References Cited

U.S. PATENT DOCUMENTS

| | | |
|---|---|---|
| 6,598,171 B1 | 7/2003 | Farmwald |
| 6,992,950 B2 | 1/2006 | Foss et al. |
| 7,079,446 B2 | 7/2006 | Murtagh |
| 7,299,330 B2 | 11/2007 | Gillingham |
| 7,337,294 B2 | 2/2008 | Garlepp et al. |
| 7,386,696 B2 | 6/2008 | Jakobs |
| 2004/0148482 A1 * | 7/2004 | Grundy et al. ................ 711/167 |
| 2007/0058410 A1 * | 3/2007 | Rajan ............................. 365/63 |

* cited by examiner

*Primary Examiner* — Jared Rutz
(74) *Attorney, Agent, or Firm* — Koppel Patrick Heybl & Philpott

(57) ABSTRACT

A memory module may include a plurality of dynamic random access memory (DRAM) chips, each of which may have one or more data input/output (D/Q) terminals. The memory module may include data redriving/retiming circuits connected to the D/Q terminals of the plurality of DRAM chips. The data redriving/retiming circuits may provide isolation between a system memory bus and the D/Q terminals of the DRAM chips.

17 Claims, 5 Drawing Sheets

© 2008 Inphi Corporation

REDRIVEN/RETIMED REGISTERED DUAL INLINE MEMORY MODULE

RELATED APPLICATION INFORMATION

This patent claims priority from Provisional Patent Application No. 60/986,225, filed Nov. 7, 2007, entitled Redriven/Retimed Registered Dual Inline Memory Module.

NOTICE OF COPYRIGHTS AND TRADE DRESS

A portion of the disclosure of this patent document contains material, which is subject to copyright protection. This patent document may show and/or describe matter, which is or may become trade dress of the owner. The copyright and trade dress owner has no objection to the facsimile reproduction by anyone of the patent disclosure, as it appears in the Patent and Trademark Office patent files or records, but otherwise reserves all copyright and trade dress rights whatsoever.

BACKGROUND

1. Field

This disclosure relates to memory modules for use in computers and other applications.

2. Description of the Related Art

Random access memory devices are widely used for working memory in computers and other electronics devices. Static random access memory (SRAM) devices will store data for as long as electrical power is applied to the memory device. Dynamic random access memory (DRAM) memory devices provide large memory capacity than SRAM devices, but the data stored in DRAM devices must be periodically refreshed. Synchronous dynamic random access memory (SDRAM) devices load commands and data based on a clock signal, which allows the memory devices to be synchronized with a computer bus. Double data rate SDRAM devices (DDR SDRAM) load and output data on both the rising and falling edges of the clock signal such that the data rate is double the clock rate. Current generation DDR3 SDRAM devices are operable at clock rates of up to 800 MHz.

Random access memory devices are commonly packaged on dual inline memory modules, or DIMMs, which may be plugged into mating connectors on a computer motherboard. Memory devices and DIMMs are generally designed in accordance with specifications published by the Joint Electron Device Engineering Council (JEDEC). JEDEC is the semiconductor engineering standardization body of the Electronic Industries (EIA), a trade association that represents all areas of the electronic industries in the United States.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having a reference designator with the same least significant digits.

DETAILED DESCRIPTION

Figure 1:
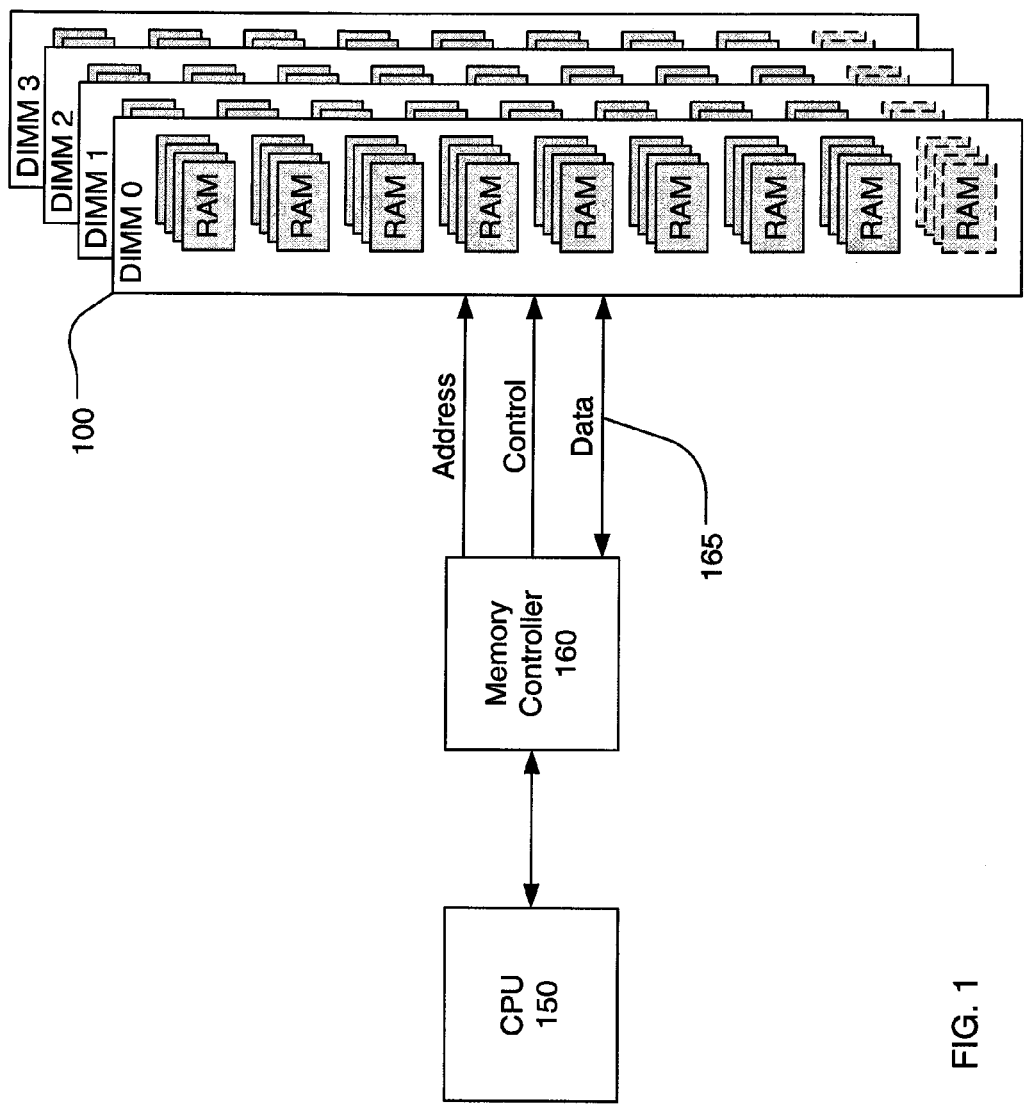
FIG. 1 is a block diagram of a computing device using dual inline memory modules (DIMMs).

Referring to FIG. 1, a computing device may include a central processing unit (CPU) 150, a system memory controller 160, and one or more Dual Inline Memory Modules (DIMMs) 100. The system memory controller 160 and the CPU 150 may be combined on a single integrated circuit chip or may be all or portions of separate integrated circuit chips. The system memory controller 160 may be a portion of a so-called "bridge" chip. The system memory controller 160 may provide address and control signals to the one or more DIMMs 100. The system memory controller 160 and the one or more DIMMs 100 may exchange bidirectional data signals over a system memory bus 165.

In this patent, the term "system memory bus" refers to a bidirectional parallel data bus used to transfer data between a CPU or memory controller and memory chips, devices, and/or modules. A "system memory bus", as used in this patent, must be distinguished from a serial interface such as the PCI Express bus or the serial interface used in Fully Buffered DIMMs (FB-DIMMS) as defined in JEDEC JESD206 and JESD82-20. For example, the system memory bus in typical personal computers comprises 64 parallel bidirectional data lines.

Each DIMM 100 may include a circuit board and a plurality of DRAM chips mounted on the circuit board. Within this description, a component is considered to be "mounted on" a circuit board if the component is supported by or attached to the circuit board directly or indirectly. In particular, components, such as DRAM memory chips, that are stacked on top of other components are considered to be mounted on the underlying circuit board. The DIMM 100 may include a multiple of 8 DRAM chips if the computing device does not use error correction. Each DRAM chip may store one or more bits for each address location. Each DIMM 100 may include a multiple of 9 DRAM chips if the computing device does use error correction, the extra bit per "byte" providing redundancy in the data signals exchanged between the memory controller 160 and the one or more DIMM 100. Each set of 8 or 9 DRAM chips is commonly termed a "rank". Currently, the capacity of each DIMM must be equal to a power of 2. Thus the number of ranks per DIMM may also be a power of 2. Each DIMM 100 may contain 1, 2, 4, 8 or more ranks, and thus may contain 8, 16, 32, or more DRAM chips (9, 18, 36, or more if error correction is used). Typically, a computing device may contain 1 to 4 DIMMs. Thus the loading on the address, control, and data signals output from the system memory controller is uncertain and may change by a factor of 16 or more depending on the quantity of DRAM chips and DIMMs installed in a specific computing device.

Figure 2:
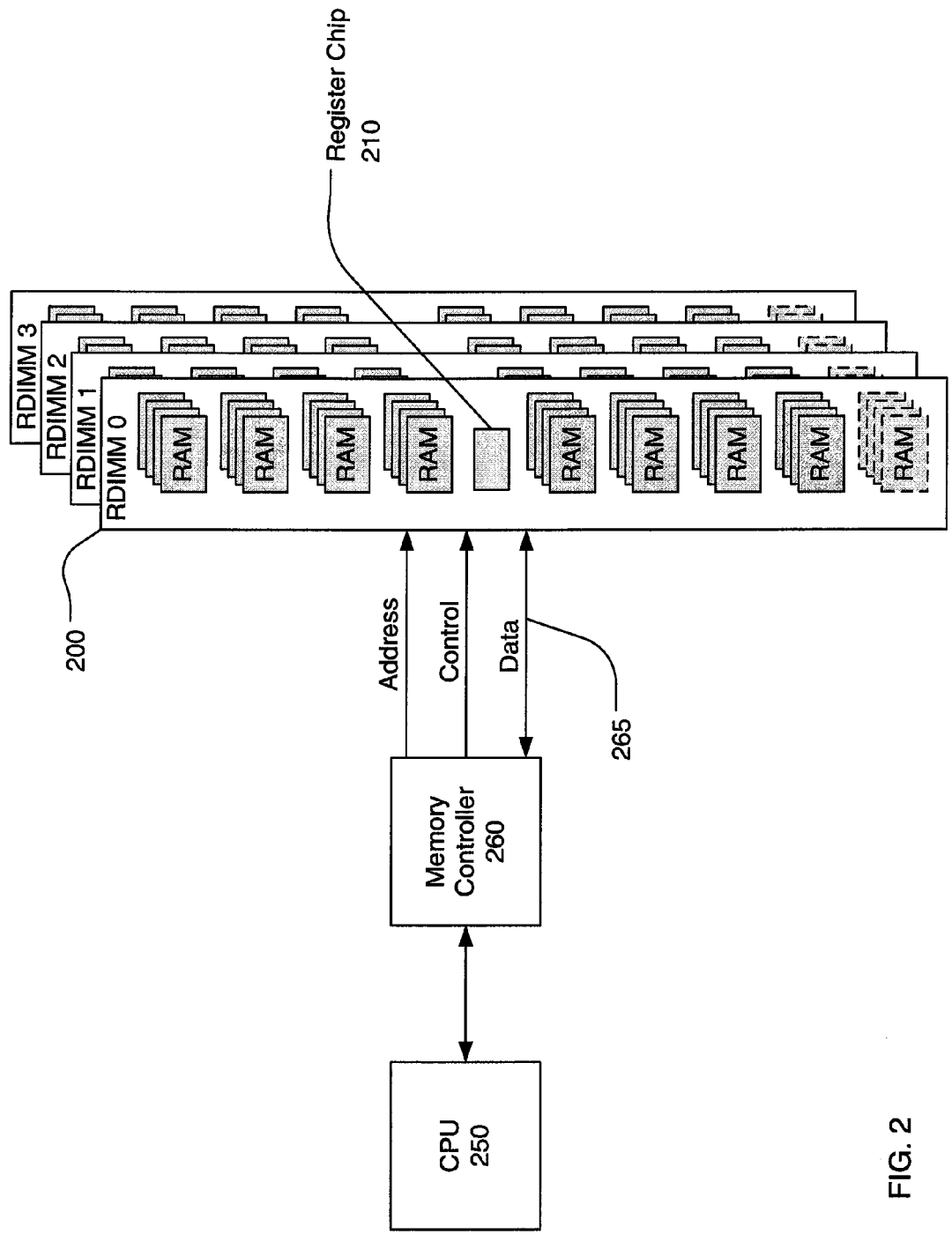
FIG. 2 is a block diagram of a computing device using registered dual inline memory modules (RDIMMs).

Referring to FIG. 2, a computing device, including a CPU 250 and a system memory controller 260, may include one or more Registered Dual Inline Memory Module (RDIMM) 200. The system memory controller 260 may provide address and control signals to the one or more RDIMMs 200. The system memory controller 260 and the one or more RDIMMs 200 may exchange bidirectional data signals over a system memory bus 265.

Each RDIMM 200 may include a circuit board supporting one to four ranks of 8 or 9 DRAM chips depending on if the computing device uses error correction. Each RDIMM 200 may contain 8, 16, 24, 32, or more DRAM chips (9, 18, 27, 36, or more if error correction is used). Each RDIMM may contain a register chip 270 which stores and buffers the address signals. Additionally, the RDIMM 200 may include circuits to buffer and regenerate clock signals and other control signals from the memory controller 260. The buffer circuits and clock regeneration circuits may be included within the register chip 270. Since the address signals and control signals are buffered by the register chip 210 or other circuits, the load presented by each RDIMM 200 on the address and control signals received from the system memory controller may be independent of the number of DRAM chips installed on the RDIMM.

Typically, a computing device may contain up to four RDIMMs. Thus the loading on the address and control signals output from the system memory controller may change by a factor of four depending on the number of RDIMMs installed in a specific computing device. Since the data signals are not buffered on the RDIMMs, the load on the data signals output from the system memory controller may change by a factor of 16 or more depending on the number of DRAM chips and DIMMs installed in a specific computing device.

Figure 3:
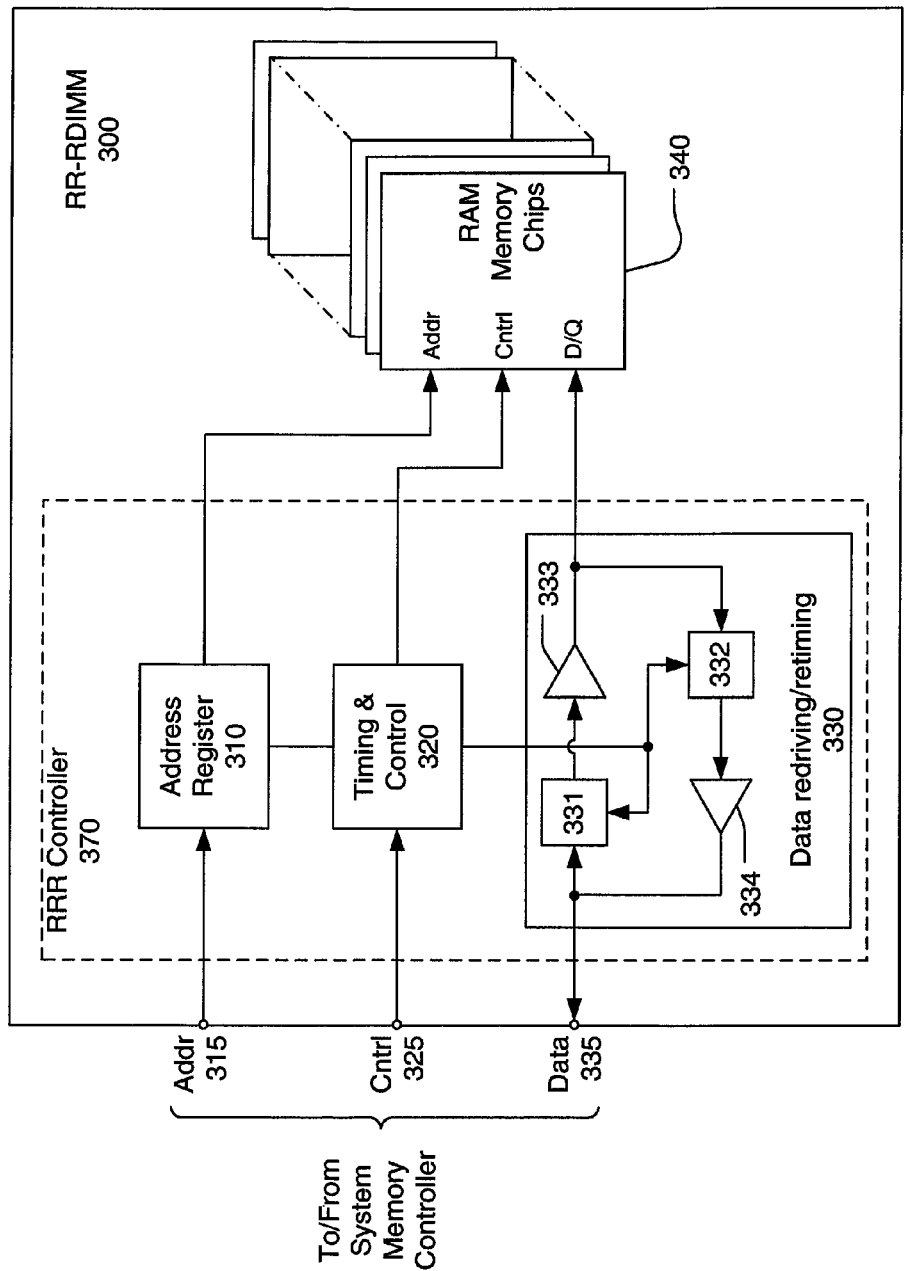
FIG. 3 is a block diagram of a redriven/retimed registered dual inline memory module (RR-RDIMM).

Referring now to FIG. 3, a redriven/retimed registered dual inline memory module 300 (RR-RDIMM) may be suitable for use in the computing devices of FIG. 1 and FIG. 2. The RR-RDIMM may include address register circuits 310, timing and control circuits 320, data redriving/retiming circuits 330 and a plurality of DRAM memory chips 340. The number of DRAM memory chips 340 may be from 8 to 36 or more chips per RR-RDIMM. The RR-RDIMM 300 may receive address signals 315 and control signals 325 from a system memory controller (not shown in FIG. 3), which may be the system memory controller 260. The RR-RDIMM may exchange bidirectional data signals 335 with the system memory controller via a system memory bus.

The address register circuits 310 may store and buffer the address signals 315. The timing and control circuits 320 may buffer and regenerate the control signals 325. The address register 310 and the timing and control circuits 320 may function similarly to the counterpart circuits on an RDIMM.

The data redriving/retiming circuits 330 may include a first data register 331 to store data signals received from the system memory controller for writing to the DRAM chips, and a second data register 332 to store data signals read from the DRAM chips to be output to the system memory controller. The first and second data registers 331, 332 may be flip-flops, latches, or other circuit elements. The first and second data registers 331, 332 may be responsive to one or more clock signal generated by the timing and control circuits 320.

The data redriving/retiming circuits 330 may include buffers 333, 334 to isolate the DRAM memory chips 340 from the system memory bus, such that the loading on the data signal lines 335 may be low and independent of the number of ranks of DRAM chips installed on the RR-RDIMM. Additionally, the voltage levels, timing, and integrity of the data signals provided by the RR-RDIMM to the system memory controller may also be independent of the number of DRAM chips installed on the RR-RDIMM. For these and other reasons, an RR-RDIMM may also be referred to as an "Isolated" DIMM or "iDIMM".

The data redriving/retiming circuits 330 may also be used, for example, to remove skew from the data signals received from or transmitted to the system memory controller. The retiming functions may be configurable to meet the requirements of specific DRAM chips and host platforms.

The address register circuits 310, the timing and control circuits 320, and the data redriving/retiming circuits 330 may be combined in a single integrated circuit component 370, herein called an "RRR controller", that may be centrally located on the RR-RDIMM module. The RRR controller 370 may have a package footprint similar to that of a conventional DDR-3 register component so that the current implementation of address, control and command signal routing can be re-used.

The address register circuits 310 and the timing and control circuits 320 may use, for example, the same timing model used in existing DDR-3 RDIMMs. The RRR controller 370 may include a phase-locked loop to regenerate a clock signal received from the system memory controller. The RRR controller 370 may include circuits similar to the clock regeneration circuits used in a DDR-3 RDIMM.

D/Q (data in/out) and DQS (data strobe) pins of the DRAM chips 340 may all be connected to the central RRR controller 370. The D/Q and DQS signals may be redriven and optionally retimed according to system requirements and the operating speeds and latency times of the DRAM chips. The data signals 335 exchanged with the system memory controller may be isolated from the loading of the DRAM chips. This may simplify the system design since there will be a uniform structure and electrical interface for a system with a specified number of RR-RDIMM slots. The system memory controller may be designed without dependence on the RR-RDIMM type, design or manufacturer. Additionally, the loading on the signals received from and exchanged with the system memory controller may be independent of the number of ranks of DRAM chips supported by a particular RR-RDIMM. Therefore the system memory bus operating speed may not be compromised by adding the capacity of more ranks of DRAM chips onto a RR-RDIMM.

The RR-RDIMM pinout may be the same as the prevailing technology so that an RR-RDIMM can be used to replace a generic RDIMM without requiring any changes to the associated system design. For example, RR-RDIMMs incorporating DDR-3 (dual data rate 3) SDRAM chips may be used in any platform designed for DDR-3 RDIMMs. The RR-RDIMM may be transparent in operation and function to a standard RDIMM. Thus an existing platform use RR-RDIMMs without changes to the physical or electrical characteristics of the host platform, or changes to the host platform BIOS or other software.

The low and consistent bus loading of RR-RDIMMS may enable future platforms to have higher memory bus speeds, more than four DIMM slots to provide increased memory capacity, or a combination of higher bus speeds and increased memory capacity. The RRR controller 370 may also be adapted to allow address splitting, such that the RRR controller 370 can present the memory to the host memory controller as having a number of ranks that is different from the number of ranks physically installed on the RR-RDIMM. For example, RR-RDIMM may contain 4 ranks of DRAM chips, each rank having m bytes, but the RRR controller 370 may present the RR-RDIMM to the host system as 2 ranks, each having 2 m bytes.

The bus isolation and signal integrity provided by the RRR controller 370 may allow RR-RDIMMs to contain more ranks of DRAM devices, or to utilize lower cost DRAM devices.

Since all of the interactions between the DRAM chips and the system memory controller may pass through the RRR controller 370, the RRR controller 370 may automatically adjust its operating parameters, such as signal timing and drive levels, to provide optimum operation. The RRR controller 370 may simply observe or snoop interactions between the system memory controller and the DRAM chips to construct an optimum set of operating parameters.

Since all of the signal and control pins of each DRAM chip may be connected to the central RRR controller 370, the RRR controller 370 may be adapted to perform a full-function, at-speed, self-test of the DRAM chips upon start-up or upon receipt of a command from the system. Since the RRR controller 370 can test the DRAM chips, the RRR controller 370 may remap a failed DRAM chip to a backup device if available. For example, the RR-RDIMM may include redundancy in the form of a single extra DRAM chip, an extra DRAM chip for each rank, or a complete redundant rank. The extra DRAM chip, chips, or rank could serve as a backup if any of the other DRAM chips failed. Remapping the failed DRAM chip to the backup DRAM chip could be done by the RRR controller 370 automatically or upon request from the system memory controller. The remapping could be transparent to the system memory controller.

Additionally, since the RRR controller 370 provides bidirectional data signals to the system memory controller, the RRR controller 370 may be adapted to allow the system memory controller to read the internal registers within the RRR controller 370. The RRR controller 370 may provide other test functions, such as echoing the address signals as data signals sent back to the system address controller. Thus the system may be adapted to perform extensive testing of the memory subsystem including the memory bus, the RRR controller device and the DRAM memory chips.

Since an RR-RDIMM may be operationally and physically similar to an existing DIMM, an RR-RDIMM may be manufactured, assembled, and tested with existing infrastructures. However, the self-test capability of the RR-RDIMM may be exploited even during manufacturing to allow lower cost testing with simplified test equipment.

Figure 4:
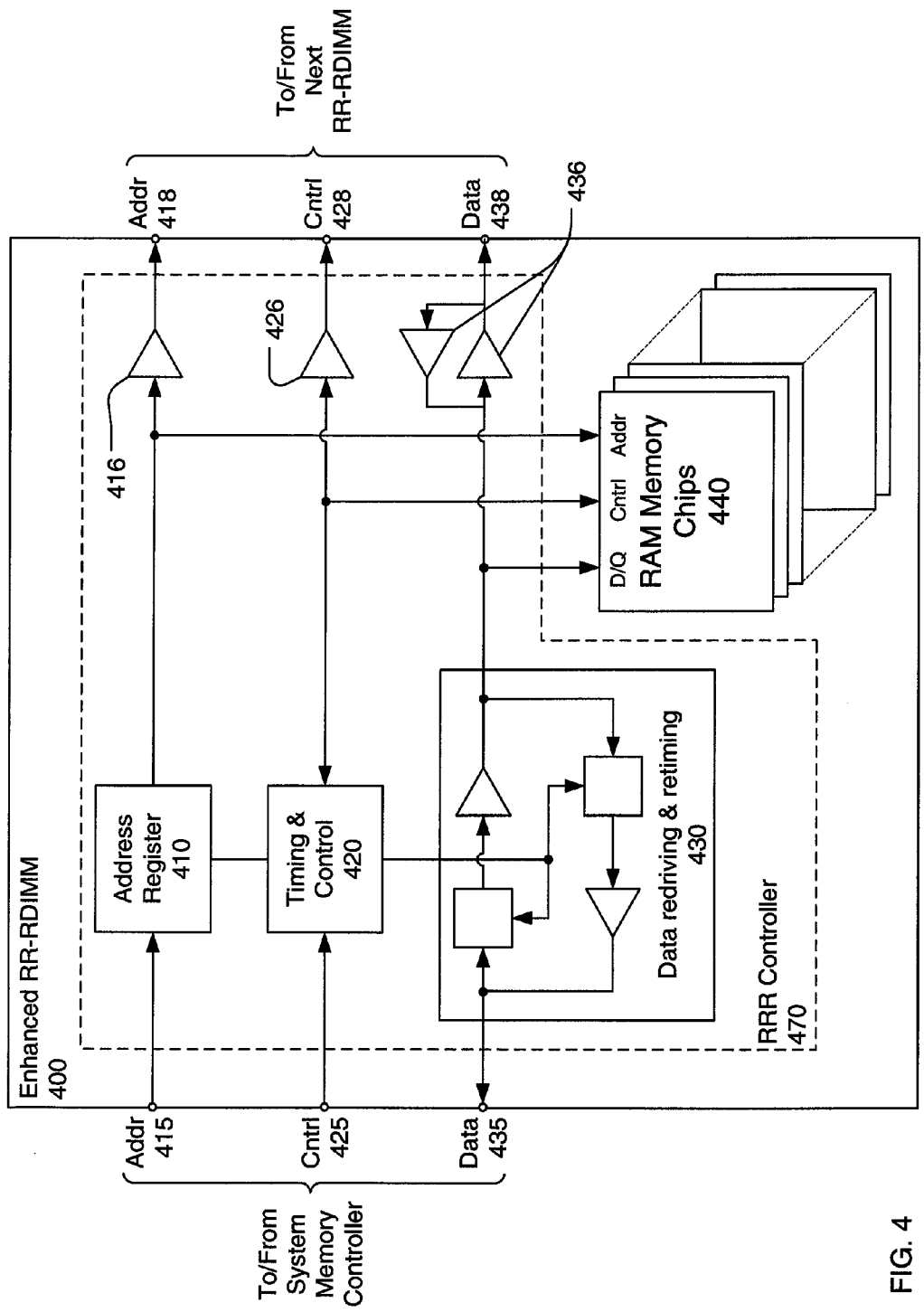
FIG. 4 is a block diagram of an enhanced redriven/retimed registered dual inline memory module.
Figure 5:
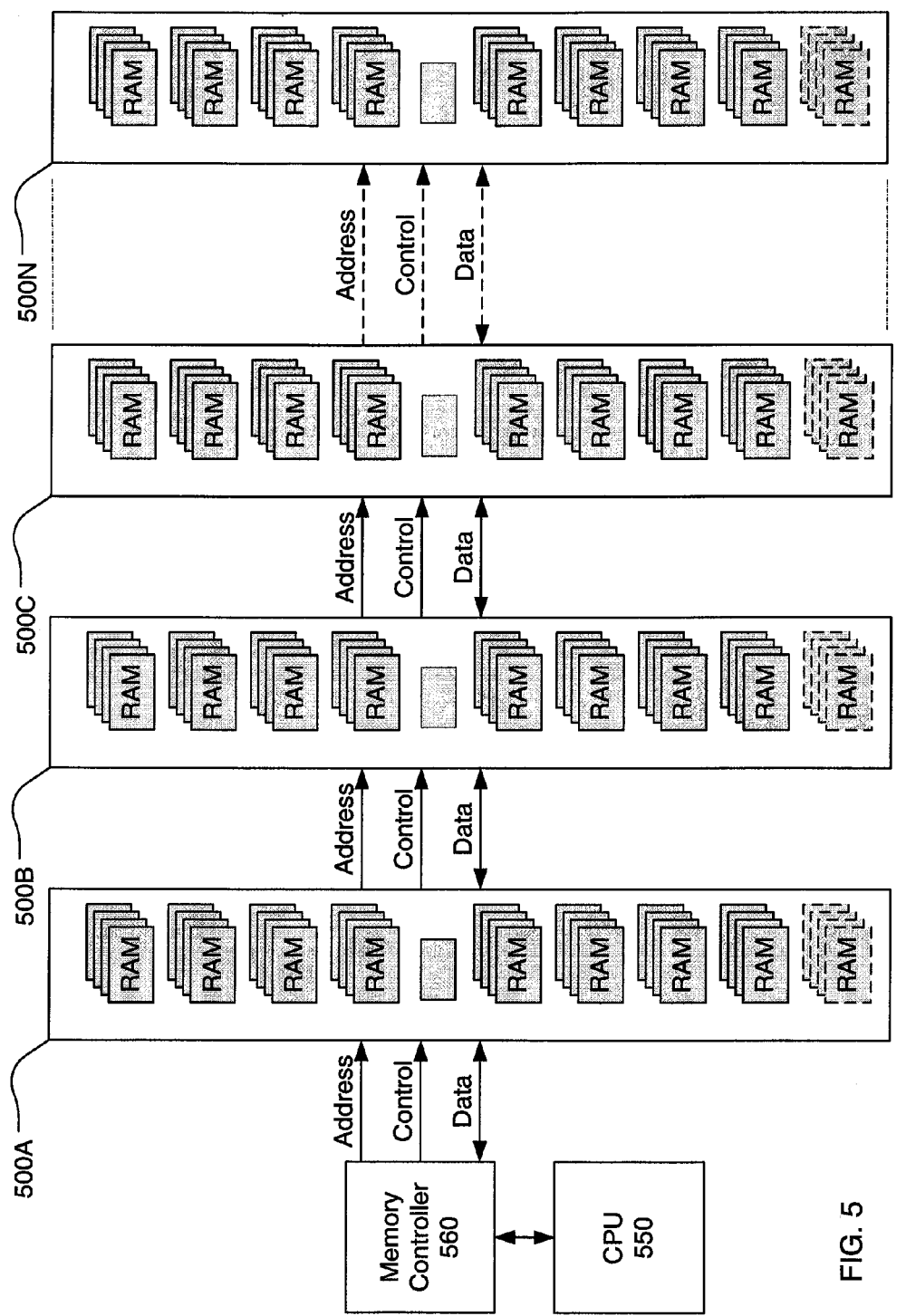
FIG. 5 is a block diagram of a computing device using enhanced redriven/retimed registered dual inline memory modules.

An enhanced RR-RDIMM module, which may provide even greater isolation between a system memory controller and one or memory modules, is shown in FIG. 4 and FIG. 5. Referring first to FIG. 4, the enhanced RR-RDIMM 400 may be similar to an RR-RDIMM and may include address register circuits 410, timing and control circuits 420, data redriving/retiming circuits 430, and a plurality of DRAM memory chips 440. Unlike an RR-RDIMM, the enhanced RR-RDIMM may provide buffered address signals 418, buffered control signals 428, and redriven data signals 438 to interface with another RR-RDIMM (not shown). The buffered address signals 418, the buffered control signals 428, and the redriven data signal 438 may be isolated from the DRAM memory chips 440 by address buffers 416, control signal buffers 426, and bidirectional data signal buffers 436, respectively.

All or portions of the address register 410, the timing and control circuits 420, the data redriving/retiming circuits 430, the address buffers 416, the control signal buffers 426, and the bidirectional data signal buffers 436 may be included in an enhanced RRR controller chip 470.

As shown in FIG. 5, a computer system may include a CPU 550, a system memory controller 560 and one or more RR-RDIMMs 500A, 500B, 500C . . . 500N. Each enhanced RR-RDIMM 500A, 500B, 500C . . . 500N may repeat incoming signals from the system memory controller or an upstream RR-RDIMM and pass them on to a downstream RR-RDIMM. In the reverse direction, each enhanced RR-RDIMM 500A, 500B, 500C . . . 500N may repeat signals from one or more downstream RR-RDIMMs back to the system memory controller. The system memory controller may view the chain of RR-RDIMMs as a single unit, though the latency may increase for transactions with downstream RR-RDIMMs. Except for the increased latency, there may be no limit on the number of enhanced RR-RDIMMS that may be cascaded.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

For means-plus-function limitations recited in the claims, the means are not intended to be limited to the means disclosed herein for performing the recited function, but are intended to cover in scope any means, known now or later developed, for performing the recited function.

As used herein, "plurality" means two or more.

As used herein, a "set" of items may include one or more of such items.

As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, "and/or" means that the listed items are alternatives, but the alternatives also include any combination of the listed items.

It is claimed:

1. A memory module, comprising:
a plurality of dynamic random access memory (DRAM) chips, each DRAM chip having one or more data input/output (D/Q) terminals, each of said D/Q terminals having an associated load such that said DRAM chips present a plurality of loads, each of said D/Q terminals conveying data; and
data redriving/retiming circuits connected between a system memory bus and the D/Q terminals of the plurality of DRAM chips such that data is written from said system memory bus to said DRAM chips in parallel and is read from said DRAM chips and conveyed to said system memory bus in parallel via said data redriving/retiming circuits;
wherein the data redriving/retiming circuits provide isolation between said system memory bus and the D/Q terminals of the DRAM chips, thereby isolating said system memory bus from said plurality of loads associated with said plurality of DRAM chips; and
wherein the data redriving/retiming circuits comprise:
a first register to store data received via the system memory bus for writing into the plurality of DRAM chips;

a second register to store data read from the plurality of DRAM chips for output to the system memory bus, wherein each of said first and second registers has an input and an output;

a first buffer arranged to receive and buffer said data stored in said first register; and a second buffer arranged to receive and buffer said data stored in said second register, wherein each of said first and second buffers has an input and an output, the output of said first register connected to the input of said first buffer, the output of said first buffer connected to the input of said second register, the output of said second register connected to the input of said second buffer, and the output of said second buffer connected to the input of said first register.

2. The memory module of claim 1, wherein the data redriving/retiming circuits impose a predetermined load on the system memory bus independent of the quantity of chips in the plurality of DRAM chips.

3. The memory module of claim 1, further comprising:
an address register connected to the plurality of DRAM chips;
wherein the address register comprises circuits to store and buffer address signals received from a system memory controller.

4. The memory module of claim 3, further comprising:
timing and control circuits connected to the plurality of DRAM chips, the data redriving/retiming circuits, and the address register;
wherein the timing and control circuits store and buffer control signals received from the system memory controller.

5. The memory module of claim 4, wherein the timing and control circuits comprise a phase locked loop to regenerate a clock signal received from the system memory controller.

6. The memory module of claim 1, wherein the first register and the second register are responsive to one or more clock signals generated by the timing and control circuits.

7. The memory module of claim 6, where the first register, the second register, and the clock signals are adapted to remove skew from data received via the system memory bus.

8. The memory module of claim 4, further comprising:
a controller chip;
wherein the controller chip includes at least portions of the data redriving/retiming circuits, the address register, and the timing and control circuits.

9. The memory module of claim 8, wherein the controller chip is adapted to test the plurality of DRAM chips independent of the system memory controller.

10. The memory module of claim 8, wherein the controller chip is adapted to map a failed DRAM chip to an extra DRAM chip among the plurality of DRAM chips.

11. The memory module of claim 8, wherein the controller chip is adapted to perform address splitting.

12. The memory module of claim 4, further comprising:
address buffers adapted to provide address signals to another memory module;
control buffers adapted to provide control signals to the other memory module; and
bidirectional data signal buffers adapted to exchange data signals with the other memory module.

13. The memory module of claim 1, wherein the plurality of DRAM chips and the data redriving/retiming circuits are provided in an isolated DIMM module.

14. A DIMM, comprising:
a plurality of dynamic random access memory (DRAM) chips, each DRAM chip having a plurality of data input/output (D/Q) terminals, each of said D/Q terminals having an associated load such that said DRAM chips present a plurality of loads;

a system memory bus comprising a bidirectional parallel data bus provided to transfer data between a memory controller and the DRAM chips; and a data redriving/retiming circuit coupled between the system memory bus and the plurality of D/Q terminals such that data is written from the system memory bus to selected DRAM chips in parallel and is read from the selected DRAM chips and provided to the system memory bus in parallel via the data redriving/retiming circuit, wherein the data redriving/retiming circuits provide isolation between said system memory bus and the D/Q terminals of the DRAM chips, thereby isolating said system memory bus from said plurality of loads associated with said plurality of DRAM chips;

wherein the data redriving/retiming circuits comprise:
a first register to store data received via the system memory bus for writing into the plurality of DRAM chips;
a second register to store data read from the plurality of DRAM chips for output to the system memory bus, wherein each of said first and second registers has an input and an output;
a first buffer arranged to receive and buffer said data stored in said first register; and
a second buffer arranged to receive and buffer said data stored in said second register, wherein each of said first and second buffers has an input and an output, the output of said first register connected to the input of said first buffer, the output of said first buffer connected to the input of said second register, the output of said second register connected to the input of said second buffer, and the output of said second buffer connected to the input of said first register.

15. The DIMM apparatus of claim 14, wherein the data redriving/retiming circuit impose a predetermined load on the system memory bus independent of the quantity of chips in the plurality of DRAM chips.

16. The DIMM apparatus of claim 14, wherein the plurality of DRAM chips and the data redriving/retiming circuit are provided in a DIMM module.

17. A method for operating a computing device, the computing device including a CPU and a DIMM, the DIMM comprising a plurality of dynamic random access memory (DRAM) devices, each of the DRAM devices having a plurality of data input/output (D/Q) terminals, each of said D/Q terminals having an associated load, the method comprising:
writing first data in parallel from a system memory bus to selected DRAM chips, the system memory bus being characterized as a bidirectional parallel data bus to transfer data between a memory controller and the DRAM devices;
reading second data in parallel from selected DRAM chips and providing the second data to the system memory bus; and
isolating, using a data redriving/retiming circuit, the system memory bus from each of the loads associated with said D/Q terminals during either the writing or the reading, such that the system memory bus is subjected to a predetermined load using the data redriving/retiming circuit independent of a quantity of the DRAM devices in the plurality of DRAM devices;

wherein the data redriving/retiming circuit comprises:
a first register to store data received via the system memory bus for writing into the plurality of DRAM chips;
a second register to store data read from the plurality of DRAM chips for output to the system memory bus, wherein each of said first and second registers has an input and an output;
a first buffer arranged to receive and buffer said data stored in said first register; and
a second buffer arranged to receive and buffer said data stored in said second register, wherein each of said first and second buffers has an input and an output, the output of said first register connected to the input of said first buffer, the output of said first buffer connected to the input of said second register, the output of said second register connected to the input of said second buffer, and the output of said second buffer connected to the input of said first register.

* * * * *